United States Patent [19]

Kitakubo

[11] Patent Number: 5,262,741
[45] Date of Patent: Nov. 16, 1993

[54] ATTENUATOR FOR HIGH-FREQUENCY SIGNAL

[75] Inventor: Kazuto Kitakubo, Tokyo, Japan

[73] Assignee: Sony Corporation, Tokyo, Japan

[21] Appl. No.: 887,061

[22] Filed: May 22, 1992

[30] Foreign Application Priority Data

May 24, 1991 [JP] Japan .................................. 3-148208

[51] Int. Cl.$^5$ ............................................ H01P 1/22
[52] U.S. Cl. .................................. 333/81 R; 333/81 A
[58] Field of Search ............... 333/103, 104, 81 R, 333/81 A, 262

[56] References Cited

U.S. PATENT DOCUMENTS

| | | | |
|---|---|---|---|
| 3,138,768 | 6/1964 | Evans | 333/262 |
| 3,179,816 | 4/1965 | Hall et al. | 333/104 X |
| 3,921,106 | 11/1975 | Williams | 333/81 R |
| 4,019,160 | 4/1977 | Kam | 333/81 R |
| 4,097,827 | 6/1978 | Williams | 333/81 R |
| 4,843,354 | 6/1979 | Fuller et al. | 333/81 A |

OTHER PUBLICATIONS

Garver, *Theory of TEM Diode Switching*, IRE Trans. on MTT, May 1967, pp. 224–238.

*Primary Examiner*—Paul Gensler
*Attorney, Agent, or Firm*—Jerry A. Miller; Pasquale Musacchio

[57] ABSTRACT

A high frequency PIN diode attenuator uses an inductive element in parallel with the PIN diode. The inductor resonates with the parasitic capacitance of the PIN diode to increase the attenuation level.

6 Claims, 5 Drawing Sheets

F I G. 7
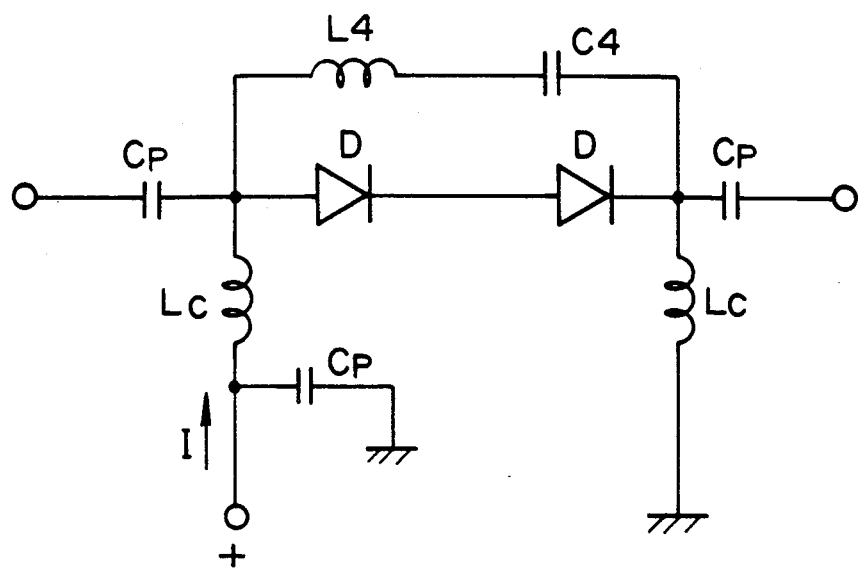

5,262,741

ATTENUATOR FOR HIGH-FREQUENCY SIGNAL

BACKGROUND OF THE INVENTION

1. Field of the Invention

This invention relates to a high-frequency attenuator using a PIN diode.

2. Background

In a high-frequency attenuator using a PIN diode, the PIN diode's attenuation level is adjusted by changing the bias current supplied to the PIN diode. This in turn changes the high- frequency resistance of the PIN diode.

FIG. 1 shows an example of the high-frequency attenuator using a PIN diode. In FIG. 1, a first capacitor Cp, PIN diode D and second capacitor Cp are serially connected in this order between input and output terminals. One end of a choke coil Lc is connected to the anode of the PIN diode and current I is supplied through the choke coil Lc to the PIN diode. The high-frequency impedance of the attenuator changes according to the current I. The other end of the choke coil is grounded through a third capacitor Cp. The cathode of the PIN diode D is grounded through a second choke coil Lc. The three capacitors are used to block direct current.

Curves A and B in FIG. 2 show the frequency characteristics of the attenuator shown in FIG. 1 when the current I is equal to 10 mA and 0 mA respectively. As shown by curve A, when the current I supplied to the PIN diode is 10 mA, the attenuation-frequency characteristics over the frequencies of interest are nearly flat. When the current I is not supplied to the PIN diode D as shown by curve B, the PIN diode D is cut off. The attenuation level for higher frequency signals is smaller than that for lower frequency signals in curve B.

A high frequency attenuator as explained above may be used in a transmitter/receiver system of a cellular phone, for example. FIG. 3 shows one example of such a cellular phone system using a high frequency attenuator. In FIG. 3, a baseband signal to be transmitted is supplied to a modulator 1 where the baseband signal is converted to an intermediate frequency band signal. The intermediate frequency band signal is, then, further converted to a high frequency signal in a radio frequency band by a local oscillator 2 and a mixer 3. The high frequency signal is amplified by an amplifier 4 and supplied to a PIN diode high frequency attenuator 5. The high frequency attenuator 5 attenuates the high frequency signal to a desired extent. The output of the high frequency attenuator 5 is then power amplified by a power amplifier 6. The output of the power amplifier 6 is supplied to a power detector 7 which detects the power at the output of the power amplifier 6.

The output of the power detector 7 is supplied to a power controller 8. Power controller 8 controls the attenuation level of the high frequency attenuator 5 according to the power detected by the power detector 7. This forms a feedback circuit comprising the power detector 7 and the power controller 8. This feedback system stabilizes the output power of the power amplifier to compensate for fluctuations in power supply voltage and operating temperature. The output of the power amplifier 6 is also supplied to a duplexer 9 and finally transmitted from an antenna 10.

In the receiver system of FIG. 3, a high frequency signal is received by the antenna 10 and supplied to a high frequency amplifier 11 through the duplexer 9. After being amplified by the high frequency amplifier 11, the high frequency signal is frequency converted to an intermediate frequency band signal by first and second stages of frequency conversion. The first stage includes a local oscillator 12, a mixer 13 and an amplifier 14. The second stage includes a local oscillator 15, a mixer 16 and an amplifier 17. The intermediate frequency band signal from the amplifier 17 is then demodulated to a baseband signal by a demodulator 18.

In the above described cellular phone system, the high frequency attenuator 5 using PIN diode is used to control the power of the signal transmitted from the antenna 10 so that the power of the transmitted signal is kept within a range required by standards or regulations.

For example, under North American cellular phone system standards, the power of the high frequency signal transmitted from an antenna has to be variable from +36 dBm to +8 dBm. Since power amplifier 6 has a constant gain, the high frequency attenuator needs a variable attenuation range which is more than 28 dB over the operating frequency band (for example, the 800 MHz band).

DESCRIPTION OF THE DRAWINGS

FIG. 7 is a fourth embodiment of the attenuator of the present invention.

OBJECTS AND SUMMARY OF THE INVENTION

It is an object of the present invention to provide a high frequency attenuator using a PIN diode with a wide variable attenuation range for a desired frequency signal.

It is another object of the present invention to provide a high frequency attenuator using a PIN diode with a high attenuation level regardless of the current supplied to the PIN diode.

It is a further object of the present invention to provide a high frequency attenuator using a PIN diode which is suitable for a cellular phone system.

DESCRIPTION OF THE INVENTION

Figure 4:
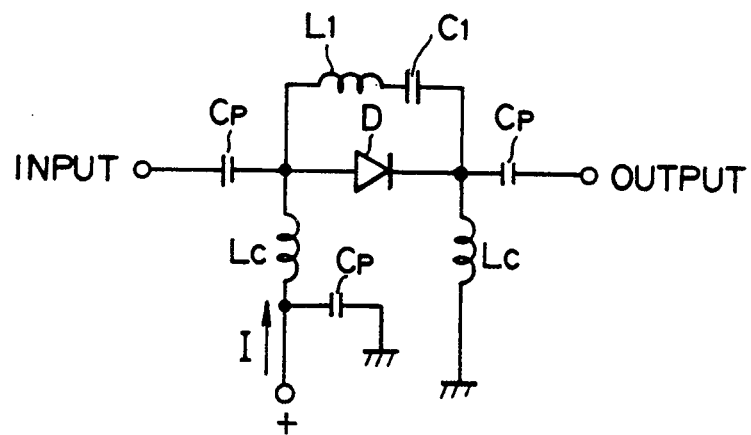
FIG. 4 is a first embodiment of the attenuator of the present invention.

FIG. 4 shows an embodiment of a high frequency attenuator using a PIN diode according to the present invention. Explanation of the circuit elements which have been already described in FIG. 1 will be omitted to avoid a redundant explanation.

In FIG. 4, an inductance coil L1 and a by-pass capacitor C1 for blocking direct current are serially connected. This serial combination is placed in parallel with PIN diode D. An internal parasitic capacitance appears between the anode and cathode of the PIN diode. The inductance of the inductance coil L1 is selected to resonate with this internal parasitic capacitance at a frequency f, which matches a desired high frequency.

Figure 1:
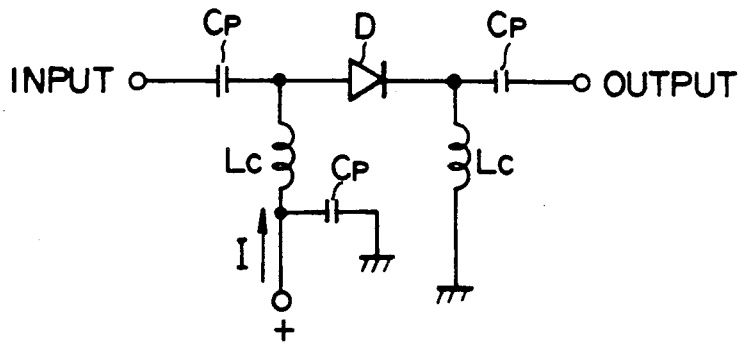
FIG. 1 is a conventional pin diode attenuator.
Figure 2:
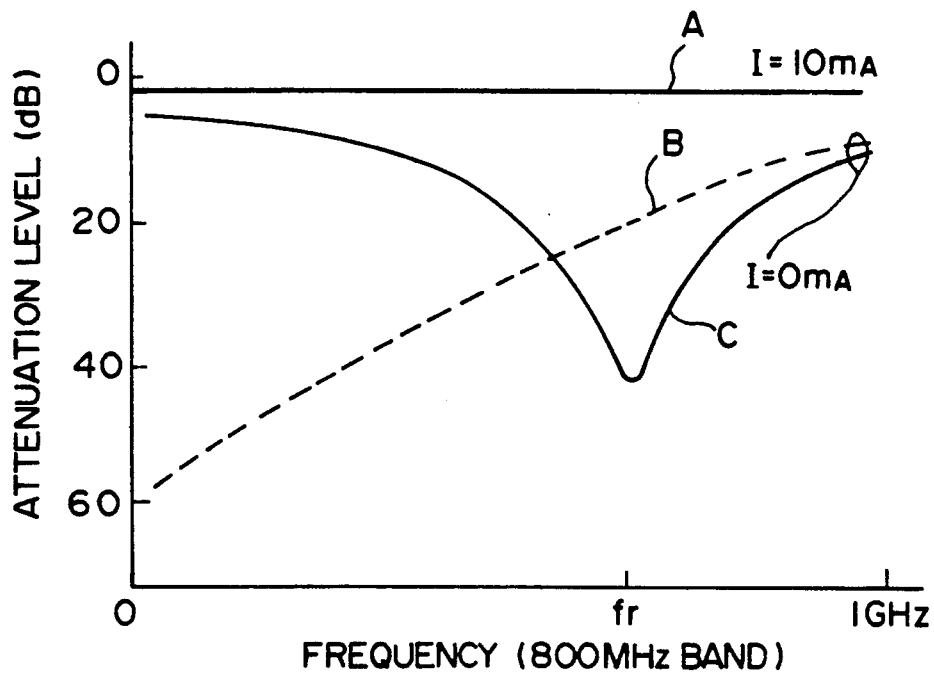
FIG. 2 is a frequency response graph of the attenuator of FIG. 1.
Figure 3:
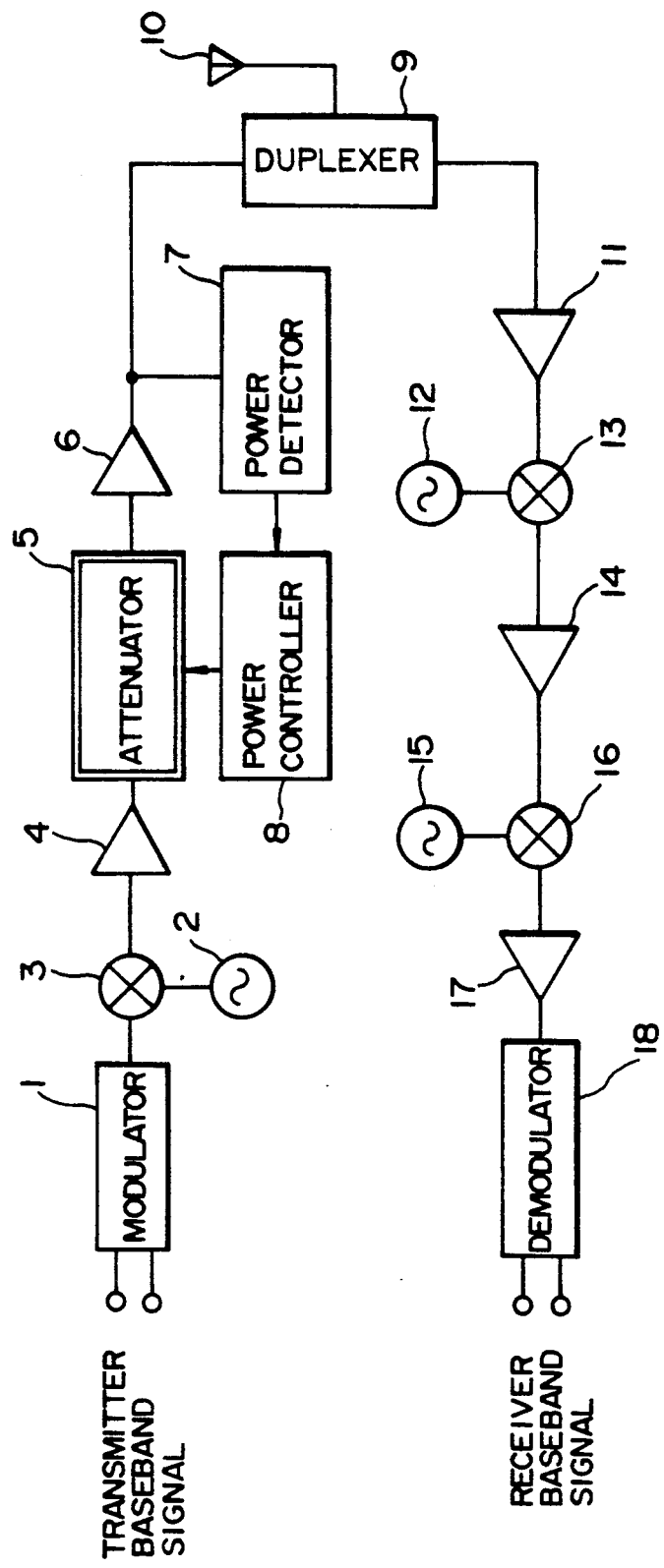
FIG. 3 is a cellular telephone system using an attenuator.

Curve C in FIG. 2 shows frequency characteristics of the attenuator shown in FIG. 4 when the current I is not supplied to the PIN diode. As shown in FIG. 2, the attenuator provides a high attenuation level at frequency f, even with no current supplied to the PIN diode. According to this embodiment, about 20 dB more attenuation can be achieved at the desired frequency, compared with the attenuator shown in FIG. 1. When the current I supplied to PIN diode D is equal to 10 mA, the frequency characteristics of the attenuators shown in FIG. 4 and FIG. 1 are same and they are described by curve A in FIG. 2.

Figure 5:
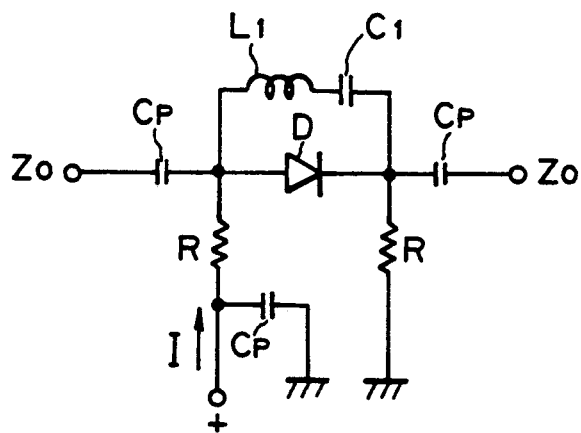
FIG. 5 is a second embodiment of the attenuator of the present invention.

FIG. 5 shows a second embodiment of the attenuator according to the invention. In this embodiment the two choke coils Lc in FIG. 4 are replaced by two resistors R respectively.

If the resistance R is chosen to be more than ten times as much as a characteristics impedance $Z_o$ of input and output of the circuit, there is almost no increase of insertion loss due to the replacement of the choke coils Lc by the resistors R. If the resistance R is chosen to be around two times as much as characteristic impedance $Z_o$, insertion loss begins to noticeably increase. However, when a relatively small impedance is used for resistors R (e.g. two times of the characteristics impedance $Z_o$) other advantages can be obtained.

When the PIN diode is OFF, its high frequency impedance becomes extremely large. Under this condition, if choke coil Lc is used as shown in FIG. 4, the input impedance of the attenuator varies due to the frequency characteristics of the choke coil LC. When relatively small resistance is used instead of the choke coil Lc, the input impedance of the attenuator is kept more stable over frequency. Therefore, even when the attenuation level of the PIN diode is changed, the Voltage Standing Wave Ratio (VSWR) of the input/output signal does not change so much. Consequently, using such a small resistance can help avoid undesirable oscillation of the system.

Figure 6:
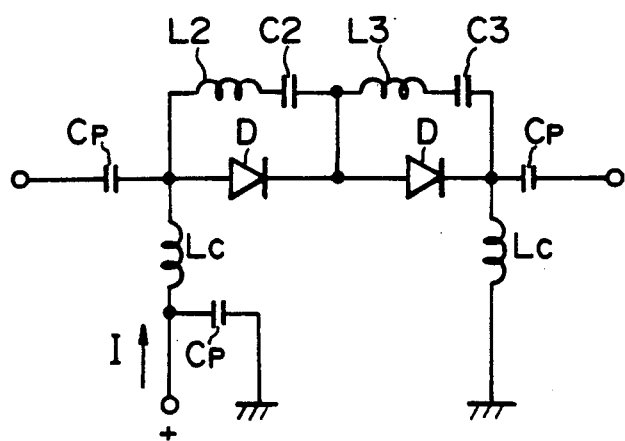
FIG. 6 is a third embodiment of the attenuator of the present invention.

FIG. 6 shows a third embodiment of the present invention. In FIG. 6, there are two sets of resonant circuits serially connected between two capacitors Cp. The first set includes an inductance coil L2, a by-pass capacitor C2 and a PIN diode D. The second set includes an inductance coil L3, a by-pass capacitor C3 and a PIN diode D. If inductance coils L2 and L3 have different inductance, the two sets of the resonant circuits have different resonant frequencies so that the frequency band over which effective attenuation is achieved can be made wider.

FIG. 7 shows a fourth embodiment. Instead of a single PIN diode, a pair of serially connected PIN diodes are used to increase the variable attenuation range. The resonant circuit shown in FIG. 7 has a single inductance coil L4 which is selected to resonate with the series combination of PIN diodes. This has the advantages that a wide dynamic range of attenuation is achieved using a small number of circuit elements compared with the third embodiment shown in FIG. 6. Alternatively, choke coil Lc in FIG. 6 and FIG. 7 can be replaced by a resistance R.

According to the present invention described above, the required amount of attenuation over the desired frequency band can be achieved, without increasing the number of PIN diode attenuation stages. Since the number of attenuation stages can be reduced, cost reduction and miniaturization of the system are possible. Furthermore, insertion loss by the attenuation stages is also reduced so that low power consumption, which is critical for the cellular phone system, can be achieved.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A high frequency attenuator including input and output terminals, said high frequency attenuator comprising:
    a first PIN diode;
    a second PIN diode serially connected to said first PIN diode between said input and output terminals;
    current supplying means for supplying control current to said first and second PIN diodes so that an attenuation level exhibited by each said PIN diode is controlled according to the current supplied to each said PIN diode;
    a first inductance element connected in parallel with said first PIN diode, wherein said first PIN diode and said first inductance element are resonant at a first predetermined frequency;
    a second inductance element connected in parallel with said second PIN diode, wherein said second PIN diode and said second inductance element are resonant at a second predetermined frequency.

2. A high frequency attenuator according to claim 1, further comprising:
    a first capacitor connected between said input terminal and said first PIN diode, for blocking direct current; and
    a second capacitor connected between said output terminal and said second PIN diode for blocking direct current.

3. A high frequency attenuator according to claim 2, further comprising:
    a third capacitor connected in series with said first inductance element so that said first PIN diode is in parallel with the series connected third capacitor and first inductance element; and
    a fourth capacitor connected in series with said second inductance element so that said second PIN diode is in parallel with the series connected fourth capacitor and second inductance element.

4. A high frequency attenuator according to claim 1, further comprising;
    a first impedance element connected to the anode of said first PIN diode; and
    a second impedance element connected to the cathode of said second PIN diode wherein said control current is supplied through said first and second impedance elements to said first and second PIN diodes.

5. A high frequency attenuator according to claim 4, wherein said first and second impedance elements are resistors.

6. A high frequency attenuator according to claim 4, wherein said first and second impedance elements are choke coils.

* * * * *